(12) United States Patent
Hirata et al.

(10) Patent No.: US 8,460,470 B2
(45) Date of Patent: Jun. 11, 2013

(54) VAPOR PHASE DEPOSITION APPARATUS AND SUPPORT TABLE

(75) Inventors: Hironobu Hirata, Shizuoka (JP); Akira Jyogo, Shizuoka (JP); Yoshikazu Moriyama, Shizuoka (JP)

(73) Assignee: NuFlare Technology, Inc., Tokyo (JP)

( * ) Notice: Subject to any disclaimer, the term of this patent is extended or adjusted under 35 U.S.C. 154(b) by 0 days.

(21) Appl. No.: 13/297,483

(22) Filed: Nov. 16, 2011

(65) Prior Publication Data

US 2012/0055406 A1 Mar. 8, 2012

Related U.S. Application Data

(62) Division of application No. 11/706,971, filed on Feb. 16, 2007, now abandoned.

(30) Foreign Application Priority Data

Feb. 21, 2006 (JP) ................................. 2006-044068

(51) Int. Cl.
*C23C 16/00* (2006.01)

(52) U.S. Cl.
USPC ........................................................ 118/725

(58) Field of Classification Search
USPC ...................... 118/724, 725, 715; 156/345.51, 156/345.52
See application file for complete search history.

(56) References Cited

U.S. PATENT DOCUMENTS

| | | | |
|---|---|---|---|
| 5,474,612 A | 12/1995 | Sato et al. | |
| 5,527,393 A * | 6/1996 | Sato et al. | 118/725 |
| 5,556,500 A | 9/1996 | Hasegawa et al. | |
| 5,855,687 A * | 1/1999 | DuBois et al. | 118/729 |
| 6,250,914 B1 | 6/2001 | Katsumata et al. | |
| 6,444,027 B1 * | 9/2002 | Yang et al. | 118/725 |
| 6,448,536 B2 | 9/2002 | Li et al. | |
| 6,646,235 B2 | 11/2003 | Chen et al. | |

(Continued)

FOREIGN PATENT DOCUMENTS

| | | |
|---|---|---|
| JP | 7-245264 | 9/1995 |
| JP | 8-208836 | 8/1996 |

(Continued)

OTHER PUBLICATIONS

Office Action issued by the Korean Patent Office on Mar. 4, 2008, for Korean Patent Application No. 10-2007-0016573, and English-language translation thereof.

(Continued)

*Primary Examiner* — Sylvia R MacArthur
*Assistant Examiner* — Michelle Crowell
(74) *Attorney, Agent, or Firm* — Finnegan, Henderson, Farabow, Garrett & Dunner, L.L.P.

(57) ABSTRACT

A vapor phase deposition apparatus includes a chamber, a support table arranged in the chamber, and having a first support unit which is in contact with a back side surface of a substrate and on which the substrate is placed and a second support unit which is connected to the first support unit to support the first support unit, a heat source arranged at a position having a distance from a back side surface of the substrate, the distance being larger than a distance between back side surface of the support table and the heat source, and which heats the substrate, a first flow path configured to supply a gas to form a film into the chamber, and a second flow path configured to exhaust the gas from the chamber.

4 Claims, 14 Drawing Sheets

U.S. PATENT DOCUMENTS

| | | |
|---|---|---|
| 6,676,804 B1 | 1/2004 | Koshimizu et al. |
| 8,100,147 B2 * | 1/2012 | Otsuki et al. ............ 137/896 |
| 2001/0015262 A1 | 8/2001 | Denpoh |
| 2006/0075972 A1 * | 4/2006 | Nakashima et al. ........ 118/729 |
| 2007/0026148 A1 * | 2/2007 | Arai et al. ............ 427/248.1 |

FOREIGN PATENT DOCUMENTS

| | | | |
|---|---|---|---|
| JP | 09063966 A | | 3/1997 |
| JP | 9-194296 | | 7/1997 |
| JP | 10284423 A | * | 10/1998 |
| JP | 2000-58471 | | 2/2000 |
| JP | 2000058471 A | * | 2/2000 |
| JP | 2000-515331 | | 11/2000 |
| JP | 2004281642 A | | 10/2004 |
| KR | 10-2006-0002975 | | 1/2006 |
| WO | WO 98/52214 | | 11/1998 |

OTHER PUBLICATIONS

Notification of Reasons for Refusal issued by the Japanese Patent Office on May 21, 2009, for Japanese Patent Application No. 2007-039609 and English-language translation thereof.

Notification of Office Action mailed by the Taiwanese Patent Office on Nov. 23, 2010, for Taiwan Patent Application No. 096104847 and English-language translation thereof.

Office Action issued by the Taiwanese Intellectual Property Office on May 12, 2011, In Taiwanese Patent Application No. 096104847, and English-language translation thereof.

* cited by examiner

Related Art

VAPOR PHASE DEPOSITION APPARATUS AND SUPPORT TABLE

CROSS-REFERENCE TO RELATED APPLICATION

This application is a division of application Ser. No. 11/706,971, filed Feb. 16, 2007 now abandoned, and is based upon and claims the benefit of priority from prior Japanese Patent Application No. 2006-044068 filed on Feb. 21, 2006 in Japan, the entire contents of both of which are incorporated herein by reference.

BACKGROUND OF THE INVENTION

1. Field of the Invention

The present invention relates to a vapor phase deposition apparatus and a support table. For example, the present invention relates to a support member (support table) which supports a substrate such as a silicon wafer in an epitaxial growth apparatus.

2. Related Art

In manufacture of semiconductor devices such as an ultrahigh-speed bipolar transistor and an ultrahigh-speed CMOS, a monocrystalline epitaxial growth technique in which an impurity concentration and a film thickness are controlled is absolutely necessary to improve the performance of devices. In epitaxial growth for vapor-growing a monocrystalline thin film on a semiconductor substrate such as a silicon wafer, an atmospheric chemical vapor deposition method is generally used. Depending on cases, a low-pressure chemical vapor deposition (LP-CVD) method is used. A semiconductor substrate such as a silicon wafer is arranged in a reaction chamber. The semiconductor substrate is heated and rotated while keeping a normal-pressure atmosphere (0.1 MPa (760 Torr)) or a vacuum atmosphere having a predetermined degree of vacuum in the reaction chamber. In this state, a silicon source and a source gas containing a dopant such as a boric compound, an arsenic compound, or a phosphorus compound are supplied. On the surface of the heated semiconductor substrate, thermal decomposition or hydrogen reduction reaction of the source gas is performed. In this manner, a silicon epitaxial film doped with boron (B), phosphorous (P), or arsenic (As) is manufactured by deposition (see Japanese Patent Application, Publication No. JP-A-09-194296, for example).

The epitaxial growth technique is also used in manufacture of a power semiconductor, for example, manufacture of an IGBT (Insulate Gate Bipolar Transistor). In the power semiconductor such as the IGBT, a silicon epitaxial film having a thickness of several 10 μm or more is required.

FIG. 25 is a top view showing an example of a state in which a silicon wafer is supported by a holder.

FIG. 26 is a sectional view showing a section in a state in which the silicon wafer is supported by the holder shown in FIG. 25.

In a holder 210 (also called a susceptor) serving as a support member for the silicon wafer 200, a counterbore hole having a diameter slightly larger than the diameter of the silicon wafer 200 is formed. The silicon wafer 200 may be placed to be fitted in the counterbore hole. In this state, the holder 210 is rotated to rotate the silicon wafer 200, so that a silicon epitaxial film is grown by thermal decomposition or hydrogen reduction reaction of a source gas supplied.

In order to uniformly grow a silicon epitaxial film on the substrate, the substrate is heated as described above, and heat escapes through an edge portion of the substrate. For this reason, in particular, the uniformity of the film thickness of the substrate at an edge portion is disadvantageously deteriorated. For this reason, although the support member is devised to be heated, further improvement is desired.

BRIEF SUMMARY OF THE INVENTION

The present invention has as its object to provide a support member to keep the temperature of a substrate edge uniform.

In accordance with embodiments consistent with the present invention, there is provided a vapor phase deposition apparatus including a chamber, a support table arranged in the chamber, and having a first support unit which is in contact with a back side surface of a substrate and on which the substrate is placed and a second support unit which is connected to the first support unit to support the first support unit, a heat source arranged at a position having a distance from a back side surface of the substrate, the distance being larger than a distance between back side surface of the support table and the heat source, and which heats the substrate, a first flow path configured to supply a gas to form a film into the chamber, and a second flow path configured to exhaust the gas from the chamber.

Also, in accordance with embodiments consistent with the present invention, there is provided a vapor phase deposition apparatus including a chamber, a support table arranged in the chamber and formed a first opening which a substrate is placed on its bottom surface, and a second opening what is an annular opening and is located on an outer peripheral side of the first opening and inside an outer peripheral side, a heat source arranged at a position having a distance from the back side surface of the substrate, the distance being larger than a distance between the substrate and the support table, and which heats the substrate, a first flow path configured to supply a gas to form a film into the chamber, and a second flow path configured to exhaust the gas from the chamber.

Further, in accordance with embodiments consistent with the present invention, there is provided a support table for placing a substrate thereon in a chamber held in a vapor phase deposition apparatus, including a first support unit being in contact with the substrate, and a second support portion connected to the first support portion and made of a material having a heat conductivity lower than that of a material used in the first support unit.

DETAILED DESCRIPTION OF THE INVENTION

First Embodiment

Film uniformity is required in process development for a sheet-feeding epitaxial growth apparatus serving as an example of a vapor phase deposition apparatus. It is apparent that as a point which affects the film uniformity, the uniformity of a silicon wafer edge is given. This is a specific phenomenon, which is so-called an edge effect appearing at a wafer edge having several mm and which is different from a phenomenon at a wafer central portion. The phenomenon is very closely related to a temperature distribution, and a temperature distribution near the edge must be preferable. As will be described later, how to increase the temperature of a part of the holder with which the edge is in contact is a key to increase an edge temperature which tends to decrease. The method of heating the holder is devised. The method will be described below with reference to the drawings.

Figure 1:
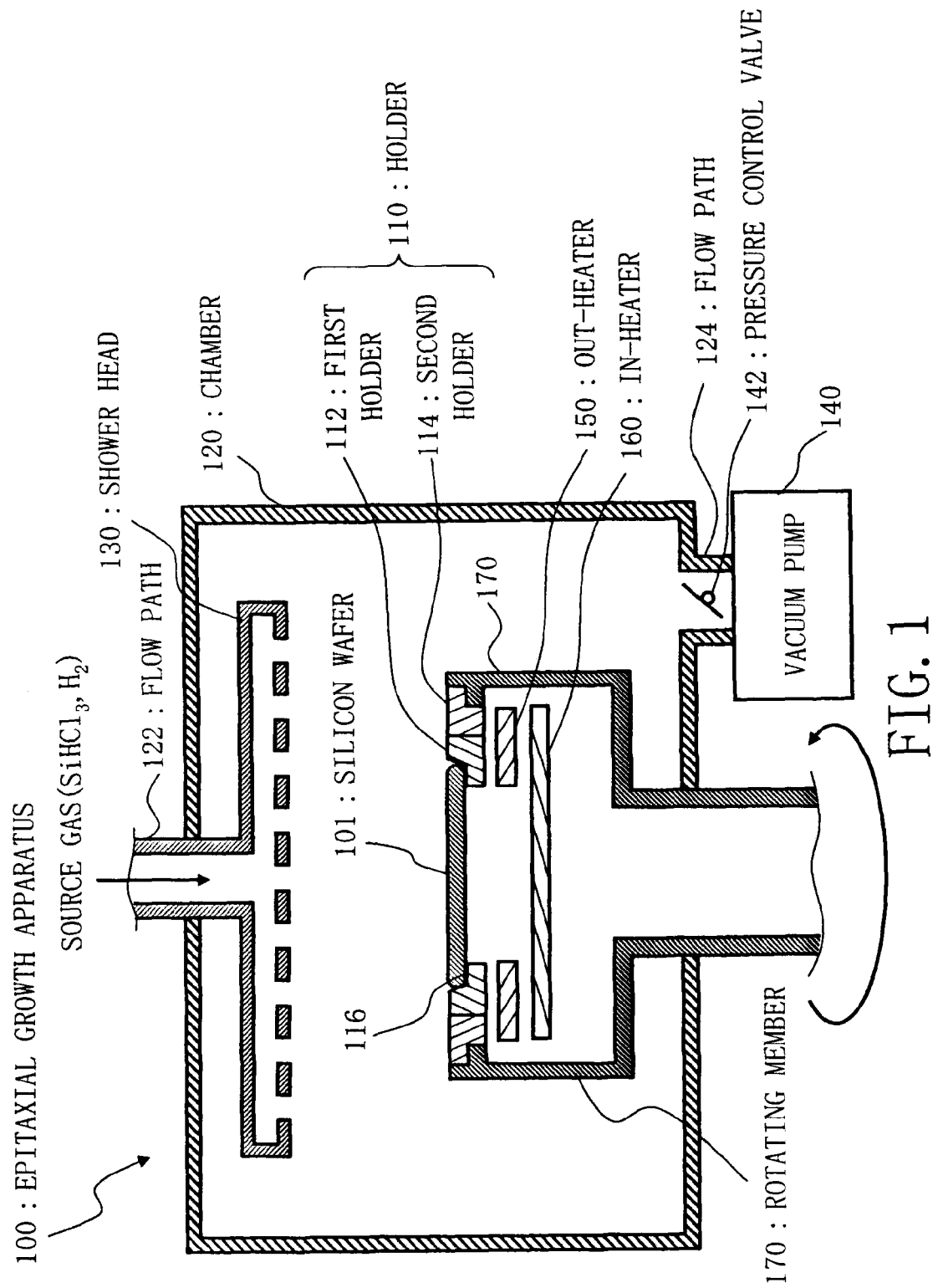
FIG. 1 is a conceptual diagram showing a configuration of an epitaxial growth apparatus according to a first embodiment.

FIG. 1 is a conceptual diagram showing a configuration of an epitaxial growth apparatus according to the first embodiment.

In FIG. 1, an epitaxial growth apparatus 100 serving as an example of a vapor phase deposition apparatus includes a holder (also called a susceptor) 110 serving as an example of a support table, a chamber 120, a shower head 130, a vacuum pump 140, a pressure control valve 142, an out-heater 150, an in-heater 160, and a rotating member 170. A flow path 122 for supplying a gas and a flow path 124 for exhausting a gas are connected to the chamber 120. The flow path 122 is connected to the shower head 130. In FIG. 1, a configuration required to explain the first embodiment is shown. However, a reduction scale and the like are not conformed to those of an actual apparatus (the same is also applied to the following respective drawings).

The holder 110 has a first holder 112 which is arranged on the inside to be in contact with a silicon wafer 101 serving as an example of a substrate and a second holder 114 arranged on the outside to be connected to the first holder 112. The first holder 112 serves as an example of the first support unit. The second holder 114 serves as an example of a second support unit. In the first holder 112, a penetrating opening having a predetermined inner diameter is formed. On a bottom surface of a depressed portion 116 dug from the upper surface side in a predetermined depth at a right angle or a predetermined angle, the silicon wafer 101 is supported to be in contact with the back side surface of the silicon wafer 101.

The second holder 114 is formed to have a circular periphery. The second holder 114 is arranged on the rotating member 170 which is rotated by a rotating mechanism (not shown) about a center line of the plane of the silicon wafer 101 perpendicular to the plane of the silicon wafer 101. The holder 110 rotates together with the rotating member 170 to make it possible to rotate the silicon wafer 101.

The out-heater 150 and the in-heater 160 are arranged on the back surface side of the holder 110. The out-heater 150 and the in-heater 160 are arranged at a position having a distance from a back side surface of the silicon wafer 101. The distance is larger than a distance between back side surface of the holder 110 and the heaters. The out-heater 150 can heat the outer peripheral portion of the silicon wafer 101 and the holder 110. The in-heater 160 is arranged under the out-heater 150 to make it possible to heat portions except for the outer peripheral portion of the silicon wafer 101. Independently of the in-heater 160, the out-heater 150 is arranged to heat the outer peripheral portion of the silicon wafer 101 to make it easy to escape heat to the holder 110. In this manner, a double-heater structure is employed to improve the in-plane uniformity of the silicon wafer 101.

The holder 110, the out-heater 150, the in-heater 160, the shower head 130, and the rotating member 170 are arranged in the chamber 120. The rotating member 170 extends from the inside of the chamber 120 to a rotating mechanism (not shown) outside the chamber 120. For the shower head 130, a piping extends from the inside of the chamber 120 to the outside of the chamber 120.

The chamber 120 serving as a reaction vessel is kept at a normal pressure or in a vacuum atmosphere having a predetermined degree of vacuum by the vacuum pump 140. In this state, the silicon wafer 101 is heated by the out-heater 150 and the in-heater 160. With rotation of the holder 110, the silicon wafer 101 is rotated at a predetermined rotating speed. While the silicon wafer 101 is rotated, a source gas serving as a silicon source is supplied from the shower head 130 into the chamber 120. Thermal decomposition or hydrogen reduction of the source gas is performed on a surface of the heated silicon wafer 101. In this manner, a silicon epitaxial film is grown on the surface of the silicon wafer 101. A pressure in the chamber 120 may be adjusted to a normal pressure or a vacuum atmosphere having a predetermined degree of vacuum by using, for example, the pressure control valve 142. Alternatively, when the chamber 120 is used in the normal pressure, the vacuum pump 140 or the pressure control valve 142 may not be used. In the shower head 130, the source gas supplied from the outside of the chamber 120 through the piping is discharged from a plurality of through holes through a buffer inside the shower head 130. For this reason, the source gas can be uniformly supplied onto the silicon wafer 101. Furthermore, the internal pressures and the external pressures of the holder 110 and the rotating member 170 are make equal to each other (a pressure of a front-surface-side atmosphere of the silicon wafer 101 and a pressure of a back surface-side atmosphere of the silicon wafer 101 are made equal to each other). In this manner, the source gas can be prevented from entering the inside of the rotating member 170 or the inside of the rotating mechanism. Similarly, a purge gas or the like on the rotating mechanism (not shown) side can be prevented from leaking into the chamber (front-surface-side atmosphere of the silicon wafer 101). In this case, the chamber 120 is exhausted by the vacuum pump 140. However, the exhausting means is not limited to the vacuum pump 140. Any means which can exhaust the chamber 120 may be used. For example, when the chamber 120 may be set at a normal-pressure atmosphere or a vacuum atmosphere having a pressure close to a normal pressure, the chamber 120 is exhausted by a blower or the like.

Figure 2:
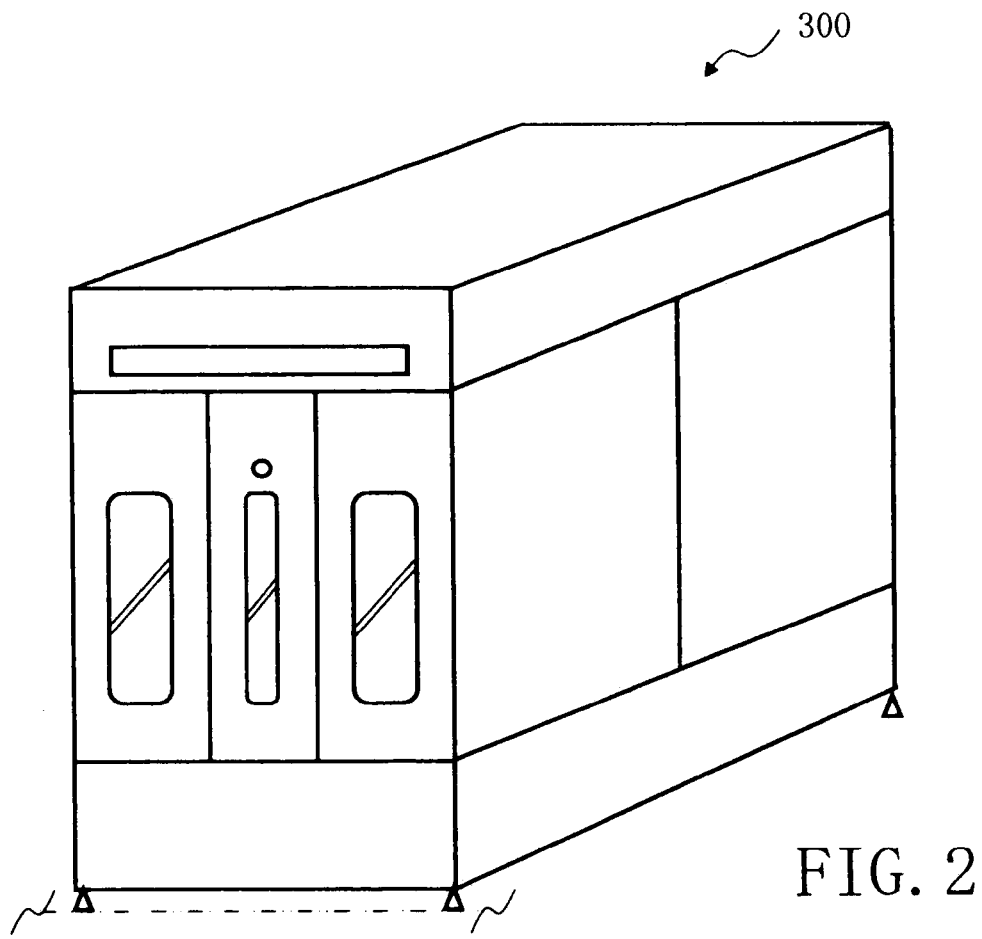
FIG. 2 is a view showing an example of the appearance of an epitaxial growth apparatus system.

FIG. 2 is a view showing an example of the appearance of an epitaxial growth apparatus system.

As shown in FIG. 2, an epitaxial growth apparatus system 300 is entirely surrounded by a housing.

Figure 3:
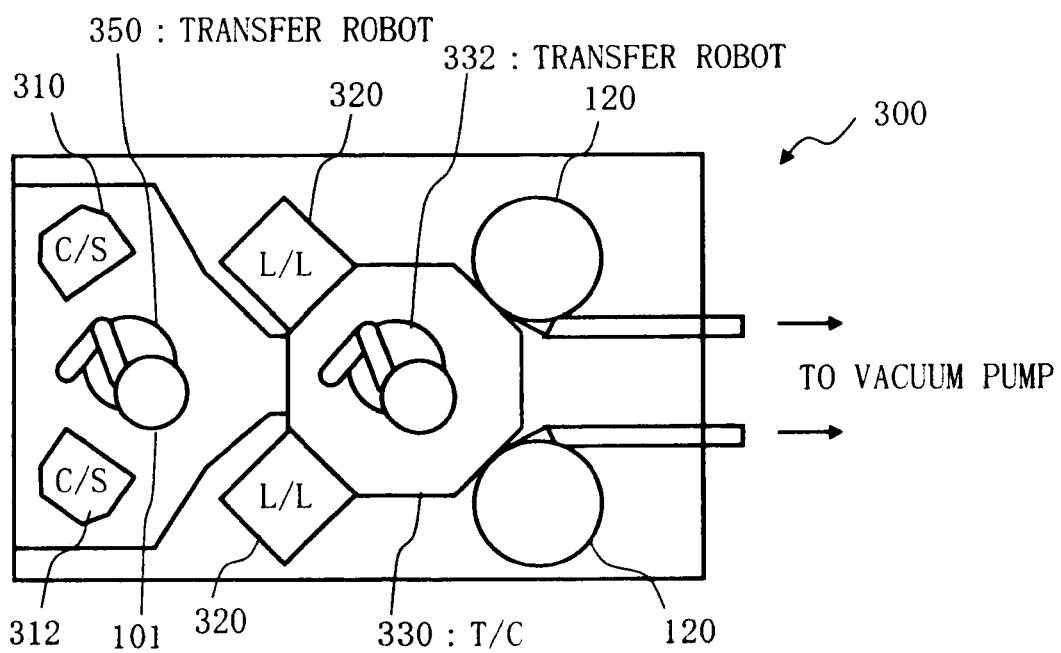
FIG. 3 is a diagram showing an example of a unit configuration of the epitaxial growth apparatus system.

FIG. 3 is a diagram showing an example of a unit configuration of the epitaxial growth apparatus system.

In the epitaxial growth apparatus system 300, a cassette is arranged on a cassette stage (C/S) 310 or a cassette stage (C/S) 312. The silicon wafer 101 set in the cassette is conveyed, or "transferred" into a load/lock (L/L) chamber 320 by a transfer robot 350. The silicon wafer 101 is conveyed from the L/L 320 into a transfer chamber 330 by a transfer robot 332 arranged in the transfer chamber 330. The conveyed the silicon wafer 101 is conveyed into the chamber 120 of the epitaxial growth apparatus 100. A silicon epitaxial film is formed on a surface of the silicon wafer 101 by an epitaxial growth method. The silicon wafer 101 on which the silicon epitaxial film is formed is conveyed from the epitaxial growth apparatus 100 into the transfer chamber 330 by the transfer robot 332 again. The conveyed silicon wafer 101 is conveyed into the L/L chamber 320. Thereafter, the transfer robot 350 returns the silicon wafer 101 from the L/L chamber 320 into a cassette arranged on the cassette stage (C/S) 310 or the cassette stage (C/S) 312. In the epitaxial growth apparatus system 300 shown in FIG. 3, two chambers 120 and two L/L chambers 320 for the epitaxial growth apparatus 100 are arranged. In this manner, a throughput can be increased.

Figure 4:
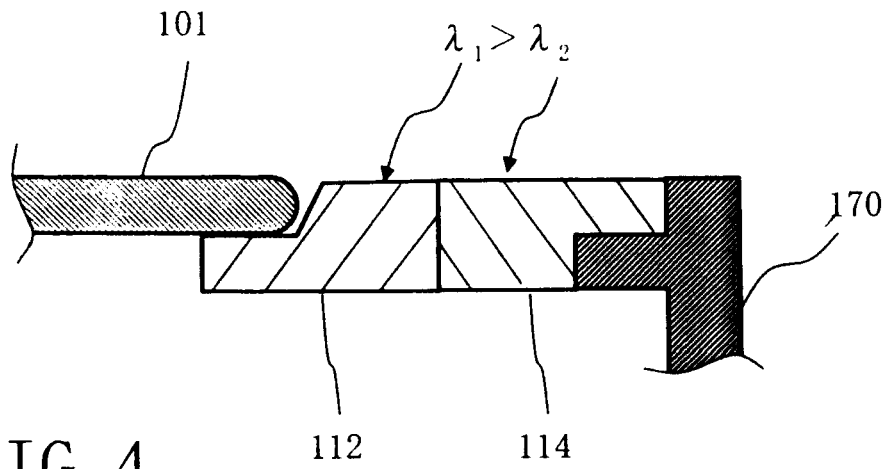
FIG. 4 is a sectional view showing an example of a state in which a silicon waver is supported by a holder.

FIG. 4 is a sectional view showing an example of a state in which a silicon wafer is supported by a holder.

In the first embodiment, as a material of the first holder 112 being in contact with a substrate, a material having a heat conductivity higher than that of a material used in the second holder 114 is used. More specifically, this configuration is designed to make a heat conductivity $\lambda_1$ of the material of the first holder 112 higher than a heat conductivity $\lambda_2$ of the material of the second holder 114. For example, silicon carbide (SiC) is preferably used as the material of the first holder 112, and silicon nitride ($Si_3N_4$) is preferably used as the material of the second holder 114. The ceramic materials such as SiC and $Si_3N_4$ are used without using metal materials to make it possible to avoid metal contamination. The materials are preferably selected such that the heat conductivity $\lambda_1$ of the material of the first holder 112 is twice or more the heat conductivity $\lambda_2$ of the material of the second holder 114.

As described above, the heat conductivity of the internal member being in contact with the substrate is made high to make the heat conductivity of the external member relatively low, so that heat generated from a heat source is conducted from the first holder 112 to the silicon wafer 101. On the other hand, the second holder 114 can be suppressed from generating heat. Therefore, heat received from the out-heater 150 serving as a heat source can be conducted to the silicon wafer 101 without loading a heater serving as a heating device (heat source). In contrast to this, heat radiated from the silicon wafer 101 can be prevented from being externally escaped. As a consequence, a temperature near the edge of the silicon wafer 101 can be more increased, and a temperature distribution near the edge of the silicon wafer 101 can be kept uniform. As a result, the film thickness uniformity of the edge portion of the silicon wafer 101 can be improved.

Figure 5:
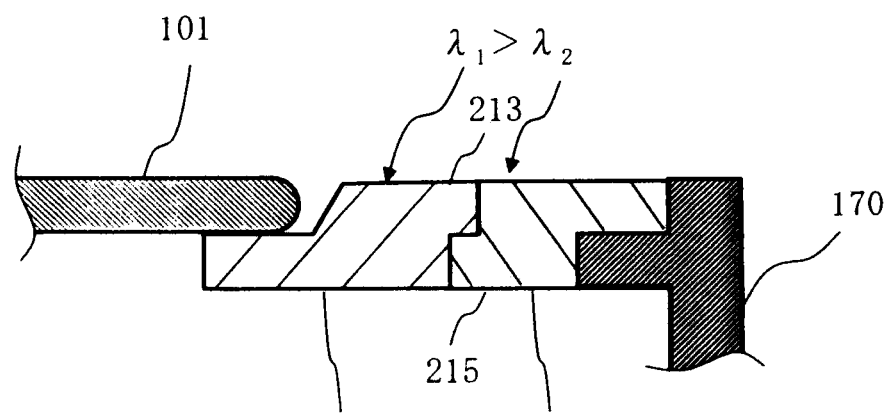
FIG. 5 is a sectional view showing another example of the state in which a silicon wafer is supported by a holder.

FIG. 5 is a sectional view showing another example of the state in which a silicon wafer is supported by a holder.

In FIG. 5, as a material of a first holder 212 being in contact with the substrate, a material having a heat conductivity $\lambda$ higher than that of a material used in a second holder 214 is used. More specifically, this configuration is designed to make a heat conductivity $\lambda_1$ of the material of the first holder 212 higher than a heat conductivity $\lambda_2$ of the material of the second holder 214. The first holder 212 and the second holder 214 are connected to each other with a step. In other words, the diameter of an upper portion of the second holder 214 on the inner peripheral side is decreased to form a projecting portion 215 extending to the inner peripheral side at a lower portion of an inner peripheral end. More specifically, a depressed portion is formed on the inner peripheral side. On the other hand, the diameter of the first holder 212 on the outer peripheral side is decreased to form a projecting portion 213 extending to the outer peripheral side at an upper portion of an outer peripheral end. An arrangement is preferable in which a back surface of the projecting portion 213 of the first holder 212 is placed on the bottom surface of the projecting portion 215 on the inner peripheral side of the second holder 214. At the connection positions, the bottom surface of the projecting portion 215 serving as the depressed portion formed on the inner peripheral side of the second holder 214 is in reliable contact with the back surface of the projecting portion 213 on the outer peripheral side of the first holder 212 placed on the bottom surface. A very small gap is formed between the outer peripheral surface of the first holder 212 and the inner peripheral surface of the second holder 214. This makes it possible to reduce a contact area between the first holder 212 and the second holder 214. For this reason, heat transfer between the first holder 212 and the second holder 214 can be made poor. With this configuration, furthermore, heat radiated from the silicon wafer 101 can be prevented from being externally escaped.

Figure 6:
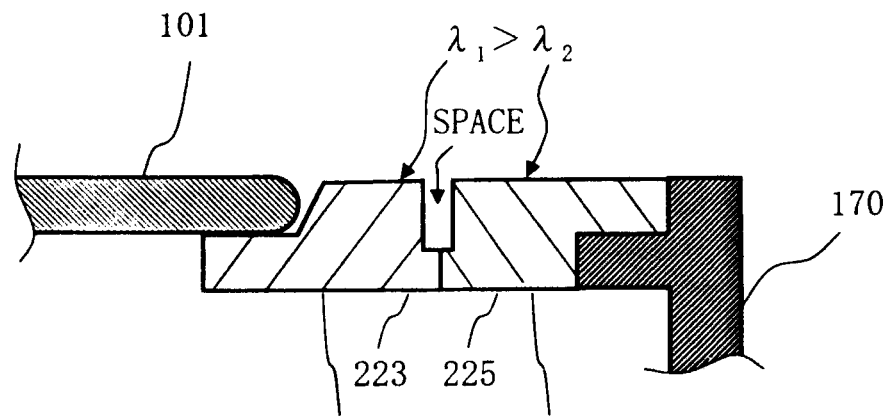
FIG. 6 is a sectional view showing still another example of the state in which a silicon wafer is supported by a holder.

FIG. 6 is a sectional view showing still another example of the state in which a silicon wafer is supported by a holder.

In FIG. 6, as a material of a first holder 222 being in contact with a substrate, a material having a heat conductivity $\lambda$ higher than that of a material used in a second holder 214 is used. More specifically, this configuration is designed to make a heat conductivity $\lambda_1$ of the material of the first holder 222 higher than a heat conductivity $\lambda_2$ of the material of the second holder 224. A notched portion is formed on at least one upper surface side of the first holder 212 and the second holder 214 at a position which the first holder 212 and the second holder 219 are connected to each other. The first holder 212 and the second holder 214 are connected to each other by forming a space (notch) therebetween. In other words, the diameter of an upper portion of the second holder 224 on the inner peripheral side is decreased to form a projecting portion 225 extending to the inner peripheral side. On the other hand, the diameter of the first holder 222 on the outer peripheral side is also decreased to form a projecting portion 223 extending to the outer peripheral side at an outer peripheral end. A distal end face of the projecting portion 225 is connected to a distal end face of the projecting portion 223 to connect the first holder 222 and the second holder 224 to each other. With this configuration, a contact area between the first holder 222 and the second holder 224 can be decreased. For this reason, heat transfer between the first holder 222 and the second holder 224 can be made poor. With this configuration, heat radiated from the silicon wafer 101 can be prevented from being externally escaped.

As for the first holder 212 and the first holder 222, like the first holder 112, silicon carbide (SiC) is preferable used as, for example, the material of the first holder 112. As for the second holder 214 and the second holder 224, like the second holder 114, silicon nitride ($Si_3N_4$) is preferably used as a material. Similarly, the materials are desirably selected such that the heat conductivities $\lambda_1$ of the materials of the first holder 212 and the first holder 222 are twice or more the heat conductivities $\lambda_2$ of the materials of the second holder 219 and the second holder 224.

In this manner, the heat conductivity of the internal member being in contact with the substrate is increased to relatively decrease the heat conductivity of the external member to make it possible to easily conduct heat received from the out-heater 150 serving as a heat source to the silicon wafer 101. In contrast to this, heat radiated from the silicon wafer 101 can be prevented from being externally escaped. Furthermore, a heater serving as a heating device (heat source) is not loaded. For this reason, a temperature near the edge of the silicon wafer 101 can be more increased. Therefore, the temperature distribution near the edge of the silicon wafer 101 can be kept uniform. As a result, the film thickness uniformity of the edge portion of the silicon wafer 101 can be improved.

Second Embodiment

In the first embodiment, a material of a holder on which the silicon wafer 101 is placed is improve to increase the temperature of the wafer edge without loading a heater serving as a heating device. A second embodiment explains a configuration in which the shape of a holder is improved without improving the material of the holder to increase the temperature of a wafer edge without loading a heater serving as a heating device.

Figure 7:
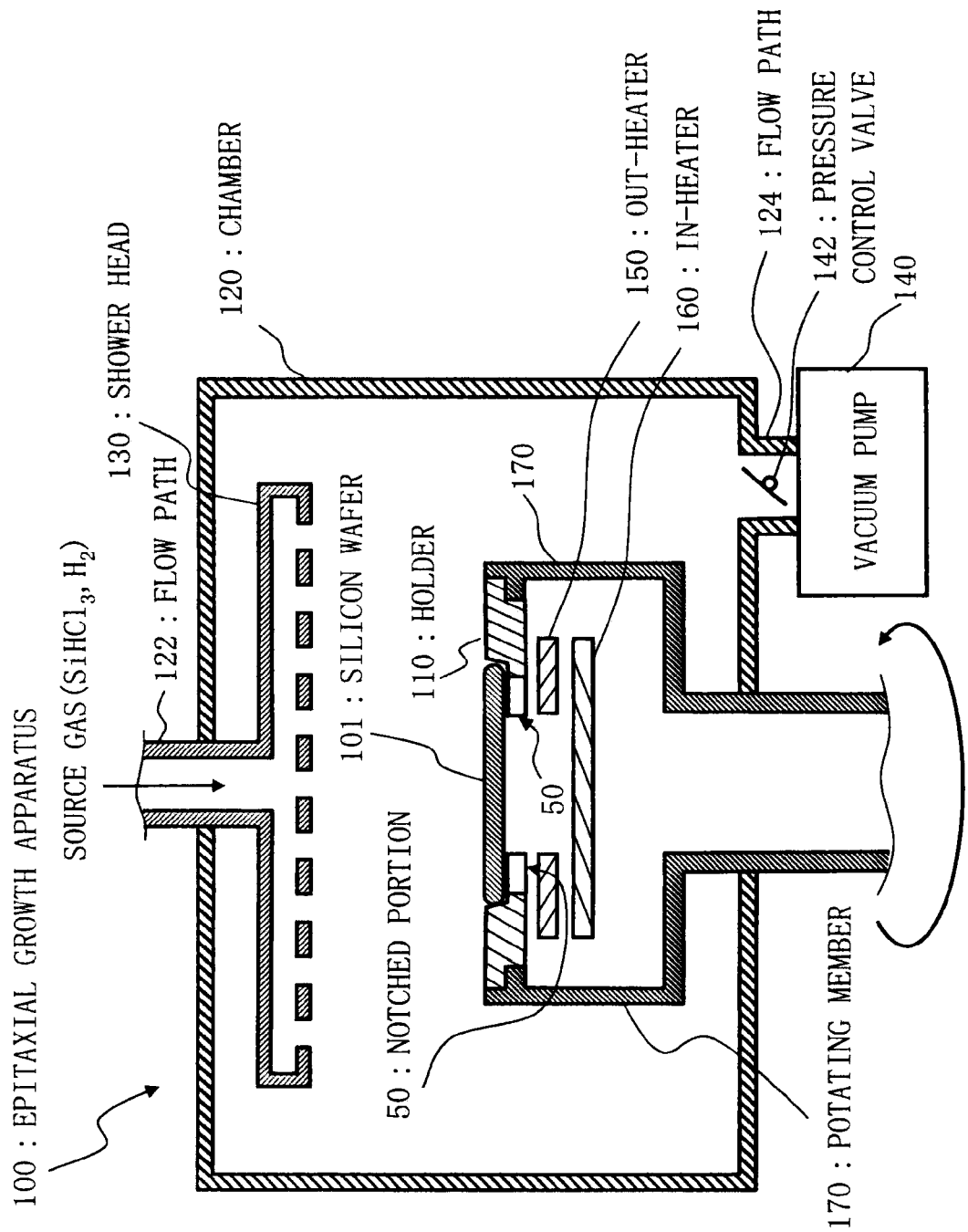
FIG. 7 is a conceptual diagram showing a configuration of an epitaxial growth apparatus according to a second embodiment.

FIG. 7 is a conceptual diagram showing a configuration of an epitaxial growth apparatus according to the second embodiment.

In FIG. 7, the same configuration as that in FIG. 1 is used except for the holder (also called a susceptor) 110 serving as an example of a support table. In the second embodiment, the same configuration as that in the first embodiment is used except for the configuration of the holder 110.

A penetrating opening having a predetermined inner diameter is formed in the holder 110 shown in FIG. 7. On a bottom surface of a depressed portion 116 dug from an upper surface side in a predetermined depth at a right angle or a predetermined angle, the holder 110 is in contact with a back side surface of the silicon wafer 101 to support the silicon wafer 101.

Figure 8:
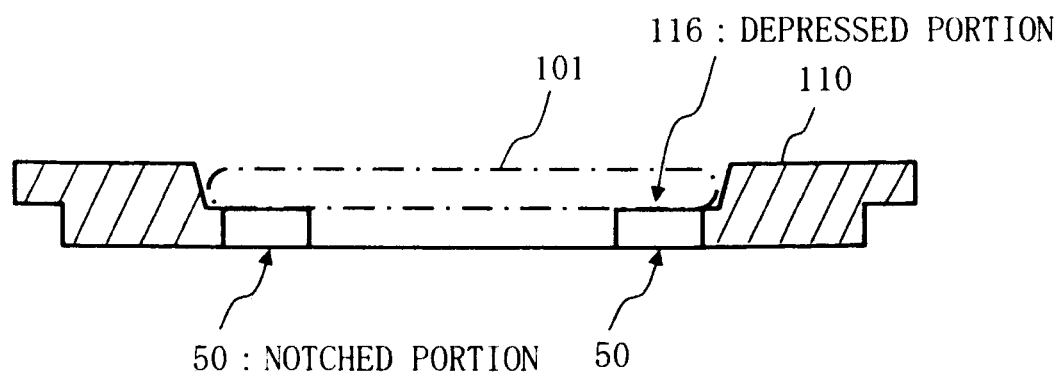
FIG. 8 is a conceptual view showing a sectional configuration of a notched holder according to the second embodiment.

FIG. 8 is a conceptual view showing a sectional configuration of a notched holder according to the second embodiment.

Figure 9:
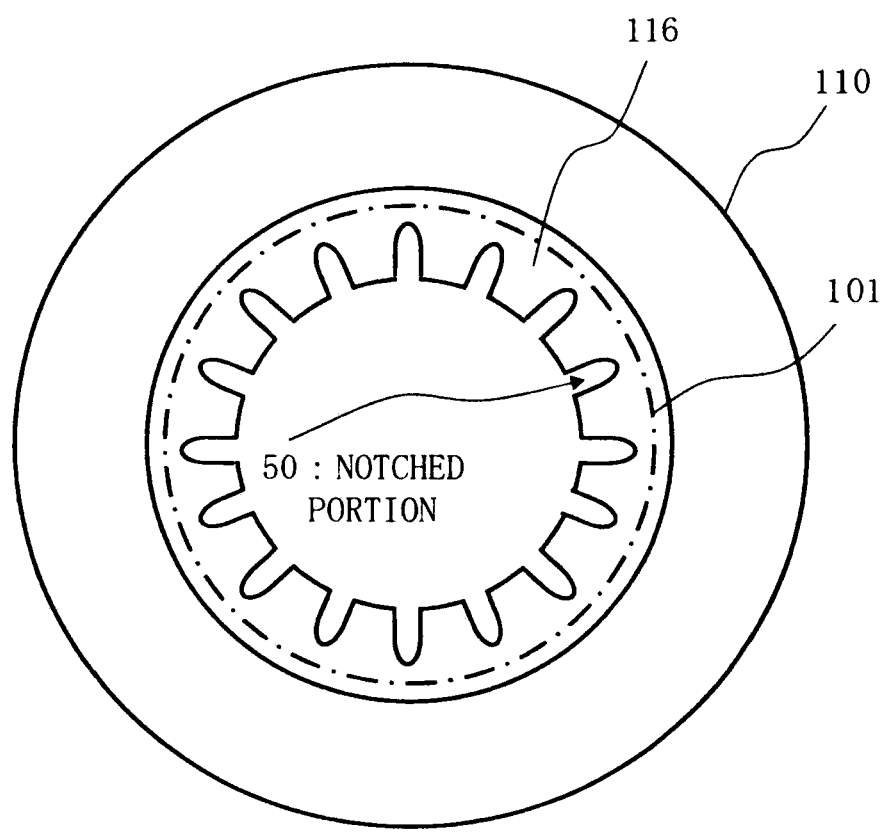
FIG. 9 is a conceptual top view of the holder shown in FIG. 8.

FIG. 9 is a conceptual top view of the holder shown in FIG. 8.

The holder 110 is formed to have a circular periphery. The first holder 110 is arranged on a rotating member 170. On the bottom surface of the depressed portion 116 of the holder 110 on which the silicon wafer 101 is placed, notched portions 50 which are uniformly radially formed at predetermined intervals as shown in FIGS. 8 and 9 are formed. More specifically, the notched portions 50 are formed on the surface of the holder 110 being in contact with the back side surface of the silicon wafer 101. In this manner, the silicon wafer 101 can directly receive heat radiated from the out-heater 150 or the in-heater 160 serving as a heat source through spaces of the notched portions 50 without passing through the holder 110. With the configuration, in particular, radiant heat from the out-heater 150 or the in-heater 160 can be easily received by the edge of the silicon wafer 101. Furthermore, the notched portions 50 are formed to make a contact area to the silicon wafer 101 small. Therefore, an area for radiating heat from the silicon wafer 101 to the holder 110 can be decreased. Therefore, an amount of radiated heat can be suppressed. A notched area of the notched portion 50 is especially preferably set at 30% or more the area of a surface on which the silicon wafer 101 is placed. In this case, a notch pattern of the notched portion 50 is not limited to the above-described pattern. A notch pattern having another shape will be explained below.

Figure 10:
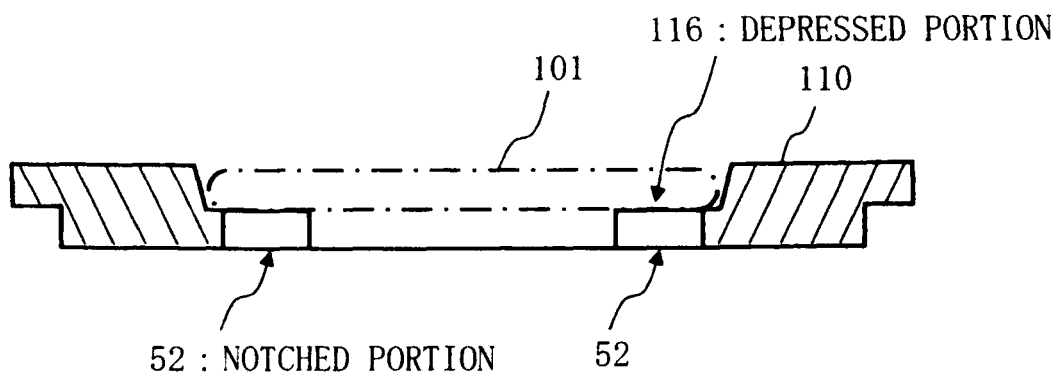
FIG. 10 is a conceptual view showing a sectional configuration of another notched holder according to the second embodiment.

FIG. 10 is a conceptual view showing a sectional configuration of another notched holder according to the second embodiment.

Figure 11:
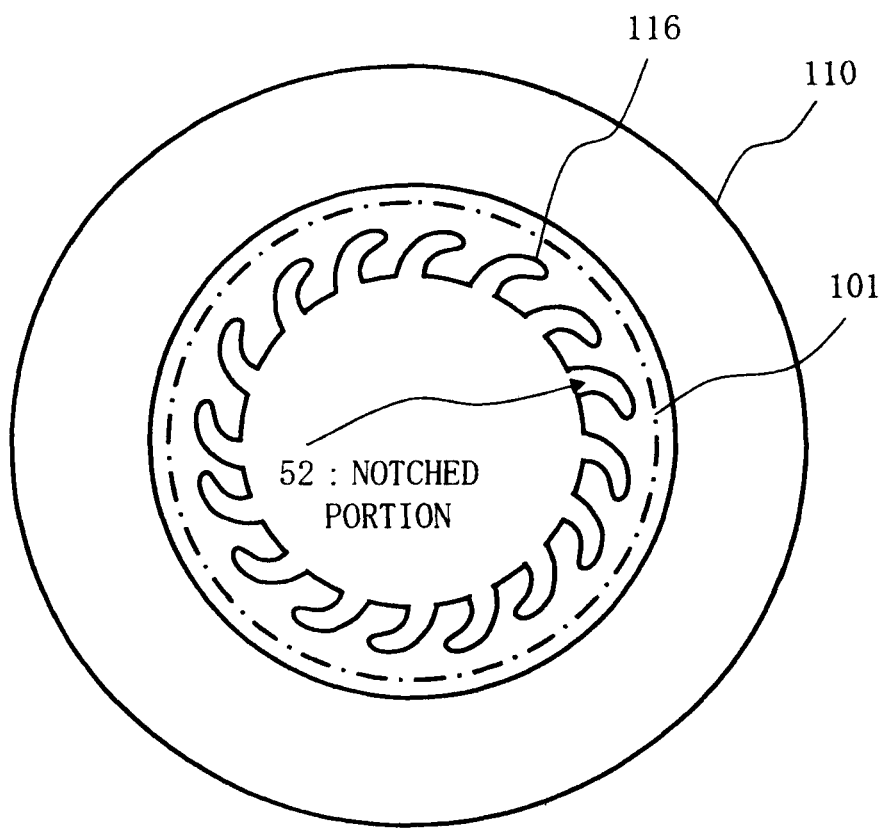
FIG. 11 is a conceptual top view of the holder shown in FIG. 10.

FIG. 11 is a conceptual top view of the holder shown in FIG. 10.

In this case, on the bottom surface of the depressed portion 116 of the holder 110 on which the silicon wafer 101 is placed, notched portions 52 are formed at predetermined intervals as shown in FIGS. 10 and 11. The notched portion 52 is formed to have a shape uniformly gradually curved from a notch start position in a circumferential direction. The configuration is preferably used. The notched portion is gradually curved from the notch start position in the circumferential direction to make it possible to decrease deviation of a space in which the silicon wafer 101 is directly heated by the out-heater 150 or the in-heater 160. The notch pattern of the notched portions 50 shown in FIGS. 8 and 9 has some position to which heat is not directly conducted at all in the radial direction of the silicon wafer 101. However, when the notch patterns shown in FIGS. 10 and 11 are used, positions to which heat is not directly conducted at all in the radial direction can be decreased or eliminated. A notch area of the notched portions 52 is especially preferably set at 30% or more the area of the surface on which the silicon wafer 101 is place as described above. In this case, although a pattern having a shape gradually curved from a notch start position in the circumferential direction is used, the pattern is not limited to this shape. For example, the pattern may be sharply bent from a straight line. Any shape which decreases or eliminates portions to which heat is not directly conducted at all in the radial direction may be used.

As described above, notches are formed on a counterbore surface of the holder 110 on which the silicon wafer 101 is placed. In this manner, radiant heat from a heater is easily received by the edge of the silicon wafer 101. Therefore, the silicon wafer 101 can be directly heated by the heat source. As a result, the temperature of the wafer edge can be increased.

Furthermore, since a contact area between the holder 110 and the silicon wafer 101 decreases, heat radiated from the silicon wafer 101 can be suppressed. Consequently, a temperature distribution near the edge of the silicon wafer 101 can be kept uniform. For this reason, the film thickness uniformity of the edge portion of the silicon wafer 101 can be improved.

Third Embodiment

A third embodiment will describe a configuration of a combination between the first and second embodiments.

Figure 12:
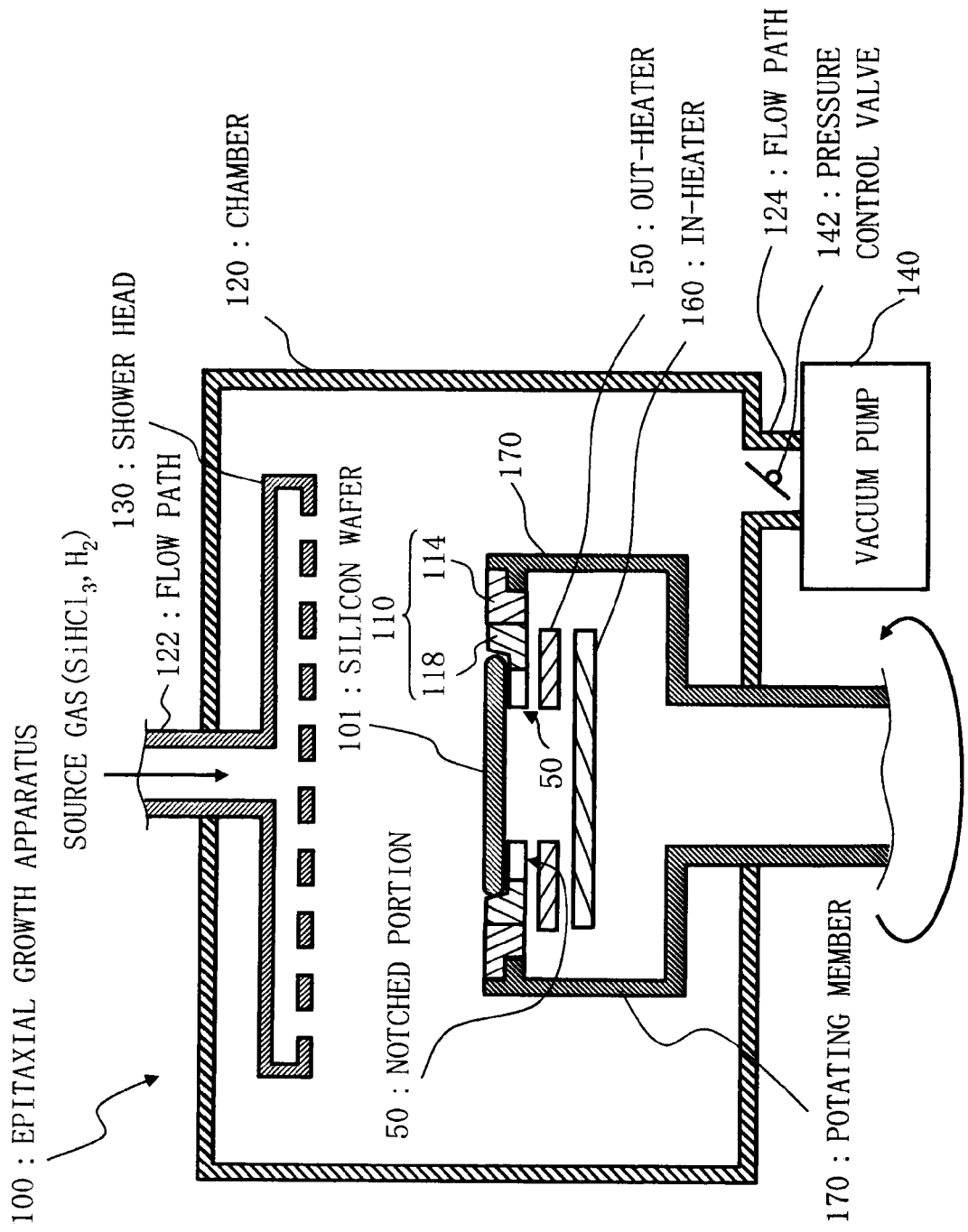
FIG. 12 is a conceptual diagram showing a configuration of an epitaxial growth apparatus according to a third embodiment.

FIG. 12 is a conceptual diagram showing a configuration of an epitaxial growth apparatus according to the third embodiment.

In FIG. 12, the same configuration as that in FIG. 1 is used except for the holder (also called a susceptor) 110 serving as an example of a support table. In the third embodiment, the same configuration as that in Embodiment 1 is used except for the configuration of the holder 110.

The holder 110 has a first holder 118 (example of a first support unit) being in contact with the silicon wafer 101 serving as an example of a substrate on the internal side and a second holder 114 (example of a second support unit) connected to a first holder 118 on the external side. A penetrating opening having a predetermined inner diameter is formed in the first holder 112. On a bottom surface of a depressed portion 116 dug from the upper surface side in a predetermined depth at a right angle or a predetermined angle, the silicon wafer 101 is supported to be in contact with the back side surface of the silicon wafer 101. The second holder 114 is formed to have a circular periphery. The second holder 114 is arranged on a rotating member 170.

Figure 13:
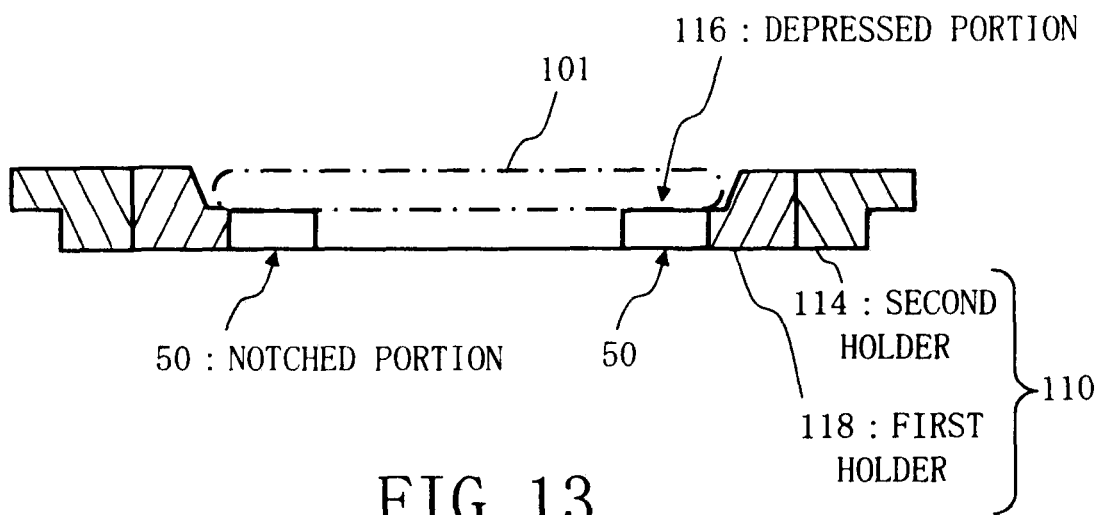
FIG. 13 is a conceptual view showing a sectional configuration of a notched holder according to the third embodiment.

FIG. 13 is a conceptual diagram showing a sectional configuration of a notched holder according to the third embodiment.

Figure 14:
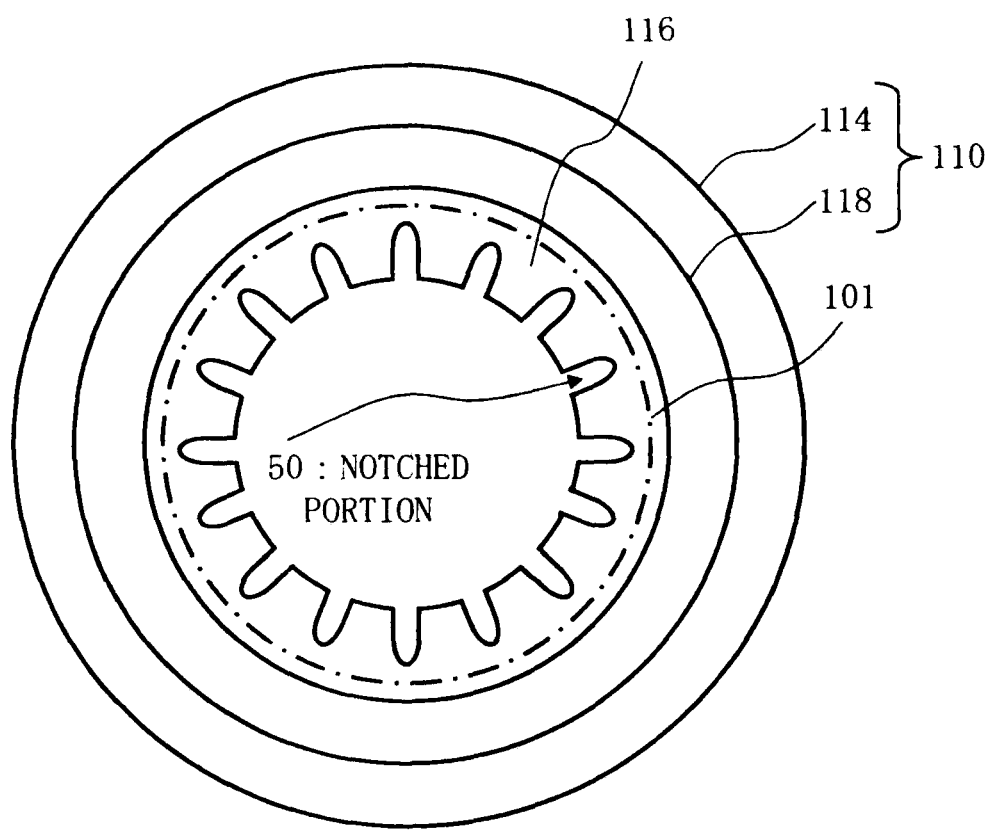
FIG. 14 is a conceptual top view of the holder shown in FIG. 13.

FIG. 14 is a conceptual top view of the holder shown in FIG. 13.

As in the first embodiment, as a material of a first holder 118 being in conduct with the substrate, a material having a heat conductivity λ, higher than that of a material used in a second holder 214 is used. More specifically, this configuration is designed to make a heat conductivity $\lambda_1$ of the material of the first holder 118 higher than a heat conductivity $\lambda_2$ of the material of the second holder 114. For example, silicon carbide ($Si_3N_4$) is preferably used as the material of the first holder 118. Silicon nitride ($Si_3N_4$) is preferably used as the material of the second holder 114. The ceramic materials such as SiC and $Si_3N_4$ are used without using metal materials to make it possible to avoid metal contamination. The materials are preferably selected such that the heat conductivity $\lambda_1$ of the material of the first holder 118 is twice or more the heat conductivity $\lambda_2$ of the material of the second holder 114. The first holder 118 and the second holder 114 are preferably connected to each other to decrease a contact area as described in FIGS. 5 and 6.

As described above, the heat conductivity of the internal member being in contact with the substrate is made high to make the heat conductivity of the external member relatively low, so that heat generated from the out-heater 150 serving as a heat source can be easily conducted to the silicon wafer 101. Furthermore, the heater serving as a heating device (heat source) is not loaded. In contrast to this, heat radiated from the silicon wafer 101 can be prevented from being escaped. In this manner, the temperature near the edge of the silicon wafer 101 can be further increased.

Furthermore, notched portions 50 which are uniformly radially formed at predetermined intervals as shown in FIGS. 13 and 14 are formed on the bottom surface of the depressed portion 116 of the first holder 118 on which the silicon wafer 101 is placed. More specifically, the notched portions 50 are formed on the surface of the holder 118 being in contact with the back side surface of the silicon wafer 101. As a consequence, the silicon wafer 101 can directly receive heat radiated from the out-heater 150 or the in-heater 160 serving as a heat source through spaces of the notched portions 50 without passing through the holder 110. With the configuration, in particular, radiant heat from the out-heater 150 or the in-heater 160 can be easily received by the edge of the silicon wafer 101. Furthermore, as in the second embodiment, the notch area of the notched portions 50 is especially preferably set at 30% or more of an area of a surface on which the silicon wafer 101 is place. In this case, a notch pattern of the notched portion 50 is not limited to the above-described pattern. A notch pattern having another shape will be explained.

Figure 15:
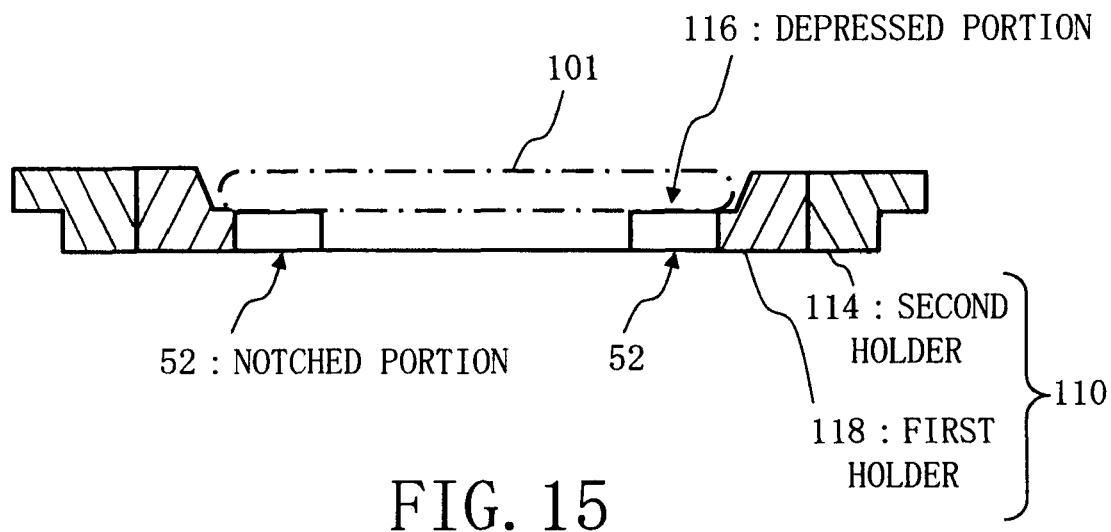
FIG. 15 is a conceptual view showing a sectional configuration of another notched holder according to the third embodiment.

FIG. 15 is a conceptual view showing a sectional configuration of another notched holder according to the third embodiment.

Figure 16:
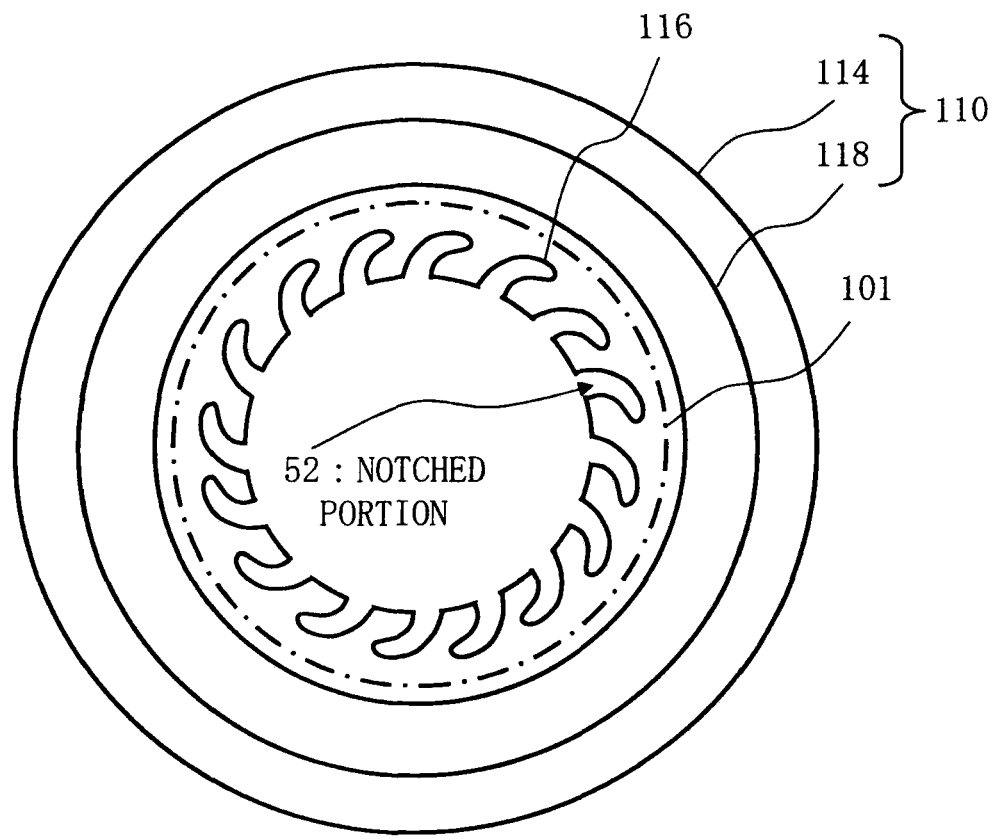
FIG. 16 is a conceptual top view of the holder shown in FIG. 15.

FIG. 16 is a conceptual top view of the holder shown in FIG. 15.

As in the second embodiment, on the bottom surface of the depressed portion 116 of the holder 110 on which the silicon wafer 101 is placed, notched portions 52 are formed at predetermined intervals as shown in FIGS. 10 and 11. The notched portion 52 is formed to have a shape uniformly gradually curved from a notch start position in a circumferential direction. The configuration is also preferably used. The notched portion is gradually curved from the notch start position in the circumferential direction to make it possible to decrease deviation of a space in which the silicon wafer 101 is directly heated by the out-heater 150 or the in-heater 160. With the configuration, positions to which heat is not directly conducted at all in the radial direction can be decreased or eliminated. A notch area of the notched portions 52 is especially preferably set at 30% or more the area of the surface on which the silicon wafer 101 is place as described above. In this case, although a pattern having a shape gradually curved from a notch start position in the circumferential direction is used, the pattern is not limited to this shape. The pattern may be sharply bent from a straight line. Any shape which decreases or eliminates portions to which heat is not directly conducted at all in the radial direction may be used. In this case as well, the first holder 118 and the second holder 114 are preferably connected to each other to decrease a contact area as described in FIGS. 5 and 6.

In this manner, notches are formed on a counterbore surface of the holder 110 on which the silicon wafer 101 is placed, so that radiant heat from a heater is easily received by the edge of the silicon wafer 101. Therefore, the silicon wafer 101 can be directly heated by the heat source. As a result, the temperature of the wafer edge can be increased. Furthermore, since a contact area between the holder 110 and the silicon wafer 101 decreases, heat radiated from the silicon wafer 101 can be suppressed.

As described above, heat received by the holder 110 from the heater can be easily conducted to the silicon wafer 101. In contrast to this, heat radiated from the silicon wafer 101 can be prevented from being externally escaped. Furthermore, in addition to the effect, the notches are formed on the counterbore surface of the holder 110 on which the silicon wafer 101 is placed to make it easy to receive radiant heat from the heater by the edge of the silicon wafer 101, so that the temperature of the wafer edge can be further increased. As a result, a temperature distribution near the edge of the silicon wafer 101 can be kept uniform. Therefore, the film thickness uniformity of the edge portion of the silicon wafer 101 can be improved.

Fourth Embodiment

In the first embodiment, the holder is divided into two members, a member made of a material having a low heat conductivity is arranged outside to suppress heat radiation. However, a method of suppressing heat radiation is not limited to the method described in the first embodiment. In a fourth embodiment, a method of suppressing heat radiation by decreasing a heat transfer area of a holder will be described.

Figure 17:
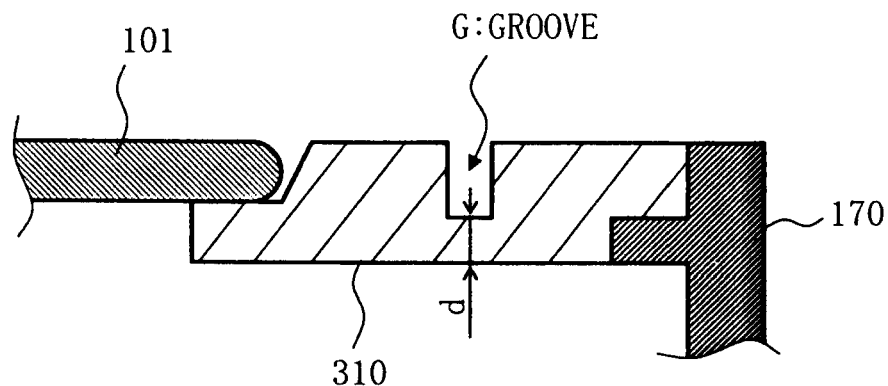
FIG. 17 is a conceptual view showing a sectional configuration of an example of a holder according to a fourth embodiment.

FIG. 17 is a conceptual view showing a sectional configuration of an example of a holder according to the fourth embodiment. The other configurations are the same as those in the first embodiment. A penetrating opening having a predetermined inner diameter is formed in a holder 310. On a bottom surface of a depressed portion (opening) dug from the upper surface side in a predetermined depth at a right angle or a predetermined angle, the silicon wafer 101 is supported to be in contact with the back side surface of the silicon wafer 101. On the holder 310, an annular groove G (second opening) is formed at a position which is located outside the depressed portion on which the silicon wafer 101 is placed and inside the outer peripheral end. When the groove G is dug in the central portion of the holder 310 throughout the circumference, whereby it becomes possible to make a thickness d of the portion where the groove G is formed smaller than the thickness of the internal portion of the groove G. Therefore, a sectional area in the circumferential direction can be decreased. As a result, a heat transfer area can be decreased. Therefore, heat radiation from the silicon wafer 101 side to the outside (on the rotating member 170 side) can be suppressed.

Fifth Embodiment

Figure 18:
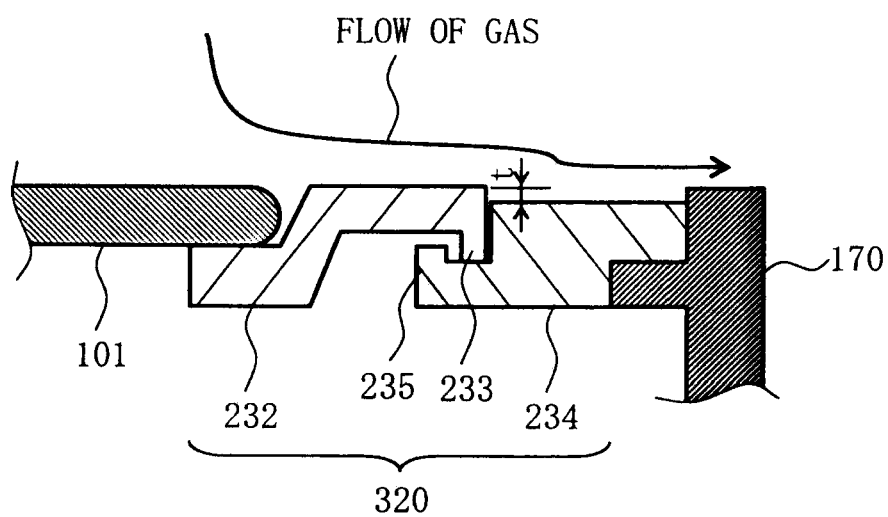
FIG. 18 is a conceptual view showing a sectional configuration of an example of a holder according to a fifth embodiment.

FIG. 18 is a conceptual view showing a sectional configuration of an example of a holder according to a fifth embodiment. The other configurations are the same as those in the first embodiment. A holder 320 has a first holder 232 being in contact with a silicon wafer 101 and arranged on the inside and a second holder 234 connected to the first holder 232 and arranged on the outside. The first holder 232 serves as an example of a first support unit. The second holder 234 serves as an example of a second support unit. A penetrating opening having a predetermined inner diameter is formed in the first holder 232. On a bottom surface of a depressed portion dug from the upper surface side in a predetermined depth at a right angle or a predetermined angle, the silicon wafer 101 is supported to be in contact with the back side surface of the silicon wafer 101. The first holder 232 has an annular projecting portion 233 extending to the back side (back surface side of the silicon wafer 101) on the outer peripheral portion. In the second holder 234, an opening which does not penetrate is formed on the inner peripheral side. In this manner, a projecting portion 235 extending to the inner peripheral side is formed on a lower portion of an inner peripheral end. The first holder 232 is supported to be in contact with a distal end portion of the projecting portion 233 on the bottom surface of the opening serving as an upper surface of the projecting portion 235. Centering (alignment of a center position) of the first holder 232 is performed on the side surface of the opening. When the first holder 232 substantially moves in a horizontal direction, a part of the side surface is brought into contact with the side surface of the opening of the second holder 234. Therefore, since the contact portion between the first holder 232 and the second holder 234 corresponds to the bottom surface of the opening and the distal end portion of the projecting portion 233, a heat transfer area can be decreased. The area of the distal end surface of the projecting portion 233 is preferably minimized. The area is more decreased to make it possible to further decrease the heat transfer area. Even if the first holder 232 and the second holder 234 are in contact with each other, the heat transfer further decreases when a simple combination is designed such that respective parts physically support the other parts. More specifically, when the first holder 232 is merely placed on a predetermined portion of the second holder 234, the heat transfer further decreases. Even though two essentially separated parts are combined to each other, some gap is generated between the contact surfaces of the parts. This physical gap (distance) may be about 10 to 30 µm. For example, it is assumed that the heat conductivities of the materials of the first holder 232 and the second holder 234 are given by 0.25 W/mm·K. When a gas entering the gap is an $H_2$ gas, the heat conductivity of the $H_2$ gas is about 0.0007 W/mm·K. In addition, when the atmosphere becomes almost vacuum, the heat conductivity further decreases with the decrease in pressure. In this manner, when the contact portion has a gap, the specific heat conductivity of the part serving as a solid state is considerably smaller than the heat conductivity of the actual contact portion. Therefore, heat transfer between the first holder 232 and the second holder 234 is considerably suppressed. For this reason, heat radiation from the silicon wafer 101 side to the outside (on the rotating member 170 side) can be considerably suppressed.

In this case, the upper surface level of the second holder 234 is desirably equal to the upper surface level of the first holder 232 or lower than the upper surface level of the first holder 232. More specifically, an offset t is desirably set at 0 or more. In this manner, a gas supplied from the upper portion of the silicon wafer 101 can be smoothly flowed to the outer peripheral side of the silicon wafer 101 without being delayed.

As in the first embodiment, as the material used in the first holder 232, a material having a heat conductivity higher than that of the material used in the second holder 234 is more preferably used.

Sixth Embodiment

Figure 19:
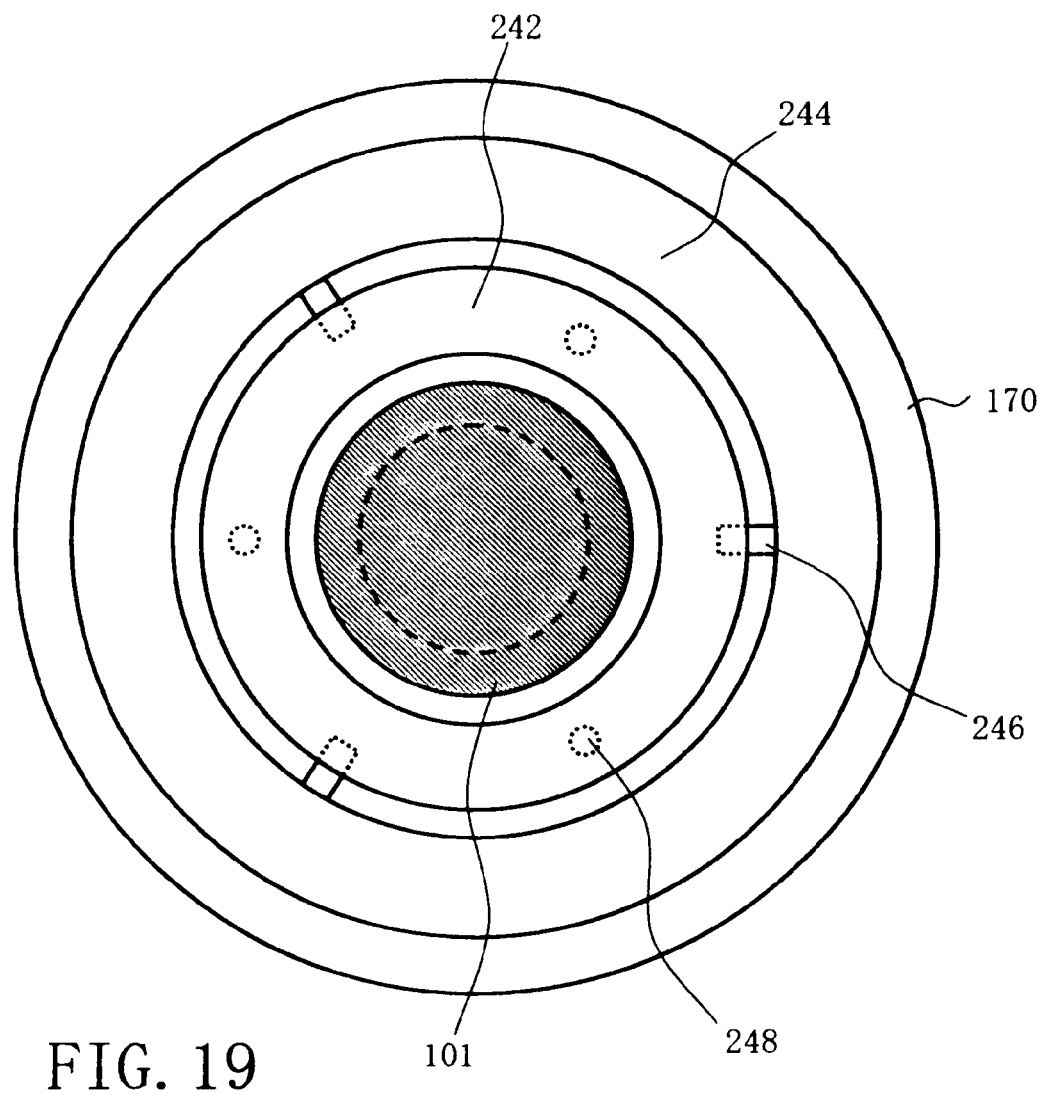
FIG. 19 is a conceptual view showing another example of a holder according to a sixth embodiment when the holder is viewed from the above.

FIG. 19 is a conceptual view showing another example of a holder according to a sixth embodiment when the holder is viewed from the above.

Figure 20:
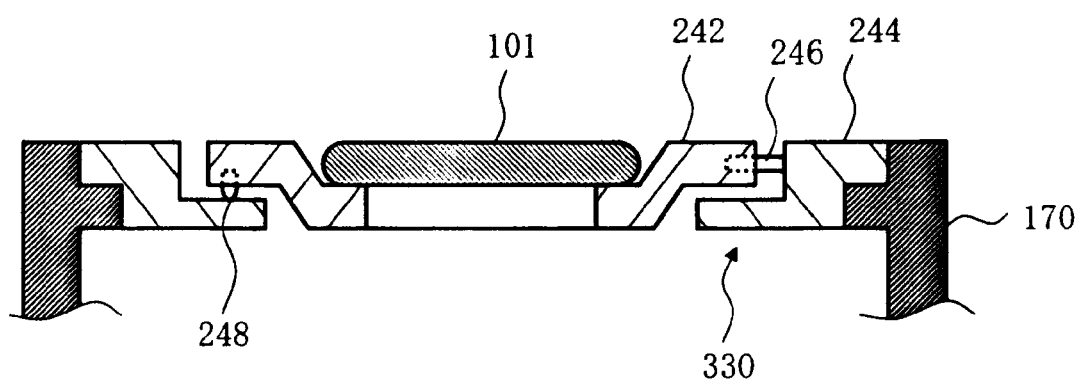
FIG. 20 is a conceptual view showing a sectional structure of the holder shown in FIG. 19.

FIG. 20 is a conceptual view showing a sectional structure of the holder shown in FIG. 19. The other configurations are the same as those in the first embodiment. A holder 330 has a first holder 242 (example of a first support unit) being in contact with a silicon wafer 101 and arranged on the inside and a second holder 244 (example of a second support unit) connected to the first holder 242 and arranged on the outside. A penetrating opening having a predetermined inner diameter is formed in the first holder 242. On a bottom surface of a depressed portion dug from the upper surface side in a predetermined depth at a right angle or a predetermined angle, the silicon wafer 101 is supported to be in contact with the back side surface of the silicon wafer 101. The first holder 242 has a plurality of projecting portions 248. The projecting portions 248 are preferably formed at three or more positions. The projecting portions 248 are preferably arranged at equal angles about an axis of rotation in such a manner as to surround the silicon wafer 101 when viewed from the above. An opening is formed in the second holder 244 on an inner peripheral side, and the first holder 242 is supported to be in contact with a distal end portion of the projecting portion 248 on a bottom surface of the opening. The first holder 242 further has a plurality of projecting portions 246 extending to the outer peripheral side. The projecting portions 246 are preferably formed at three or more positions. The projecting portions 246 are preferably arranged at equal angles about an axis of rotation when viewed from the above. When the first holder 242 substantially moves in a horizontal direction, some of the projecting portions 246 are brought into contact with the side surface of the opening of the second holder 244. In this manner, centering (alignment of a center position) of the first holder 242 is performed. As described above, the distal end portion of the projecting portions 248 is in contact with the second holder 244 to make it possible to decrease a heat transfer area. Therefore, heat radiation from the silicon wafer 101 side to the outside (on the rotating member 170 side) can be suppressed.

In this case, the projecting portions 246 and the projecting portions 248 may be formed integrally with the first holder 242 or separately formed as different parts. In particular, when the projecting portions 246 and the projecting portions 248 are different parts, only openings may be formed to fix the projecting portions to the first holder 242. For this reason, processing for the first holder 242 is preferably simple.

Figure 21:
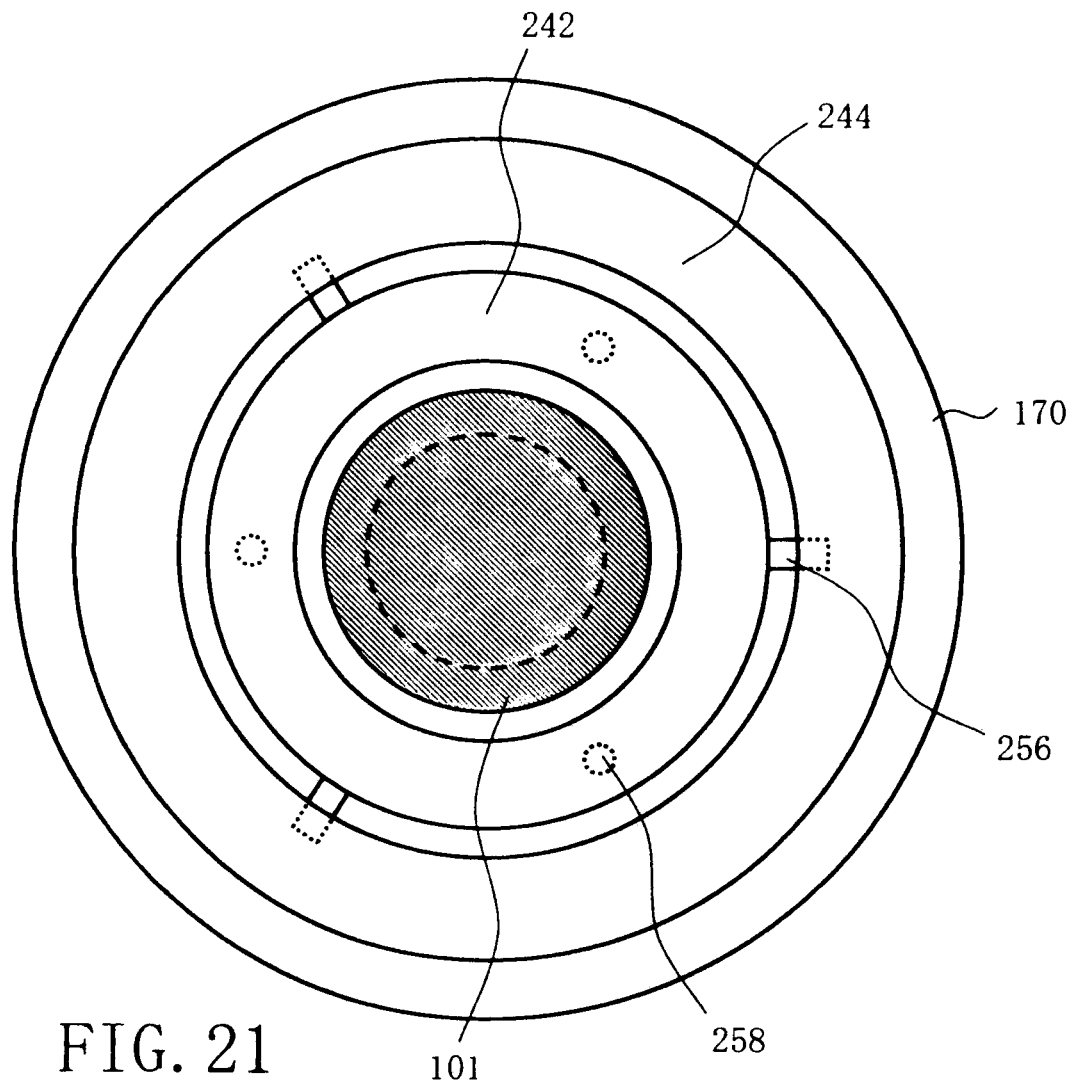
FIG. 21 is a conceptual view showing still another example of the holder according to the sixth embodiment.

FIG. 21 is a conceptual view showing still another example of the holder according to the sixth embodiment when the holder is viewed from the above.

Figure 22:
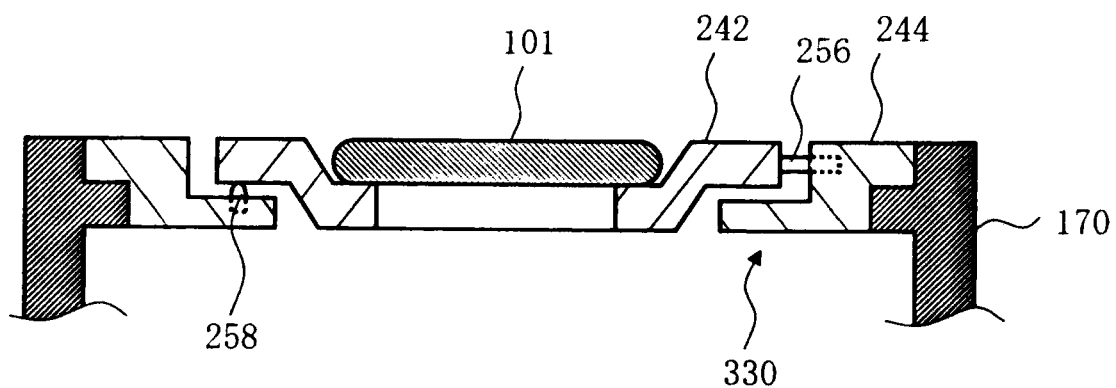
FIG. 22 is a conceptual view showing a sectional configuration of the holder shown in FIG. 21.

FIG. 22 is a conceptual view showing a sectional configuration of the holder shown in FIG. 21.

Figure 23:
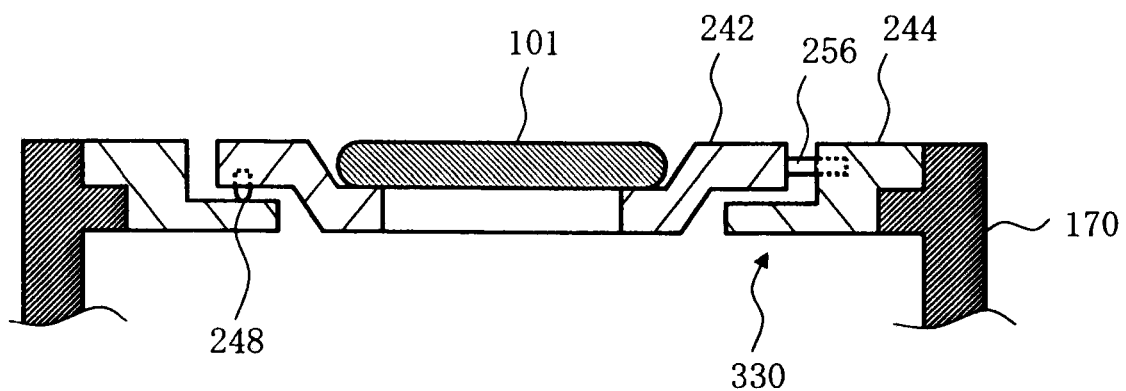
FIG. 23 is a conceptual view showing another example of a sectional configuration of the holder.
Figure 24:
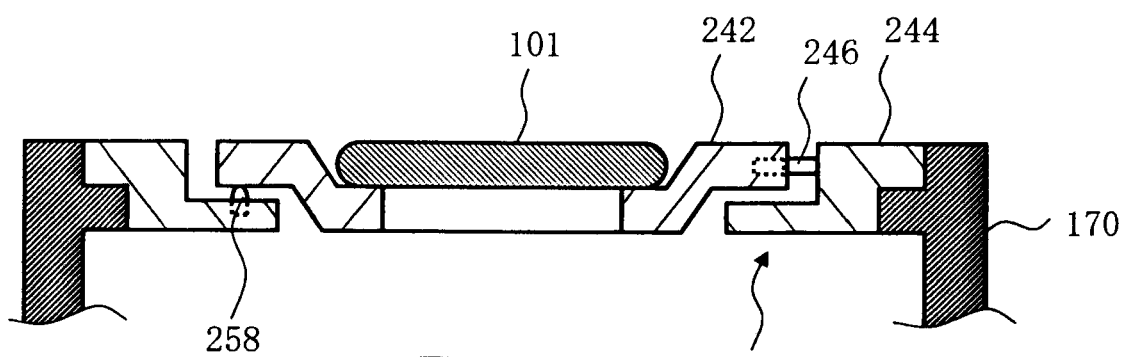
FIG. 24 is a conceptual view showing another example of a sectional configuration of the holder.
Figure 25:
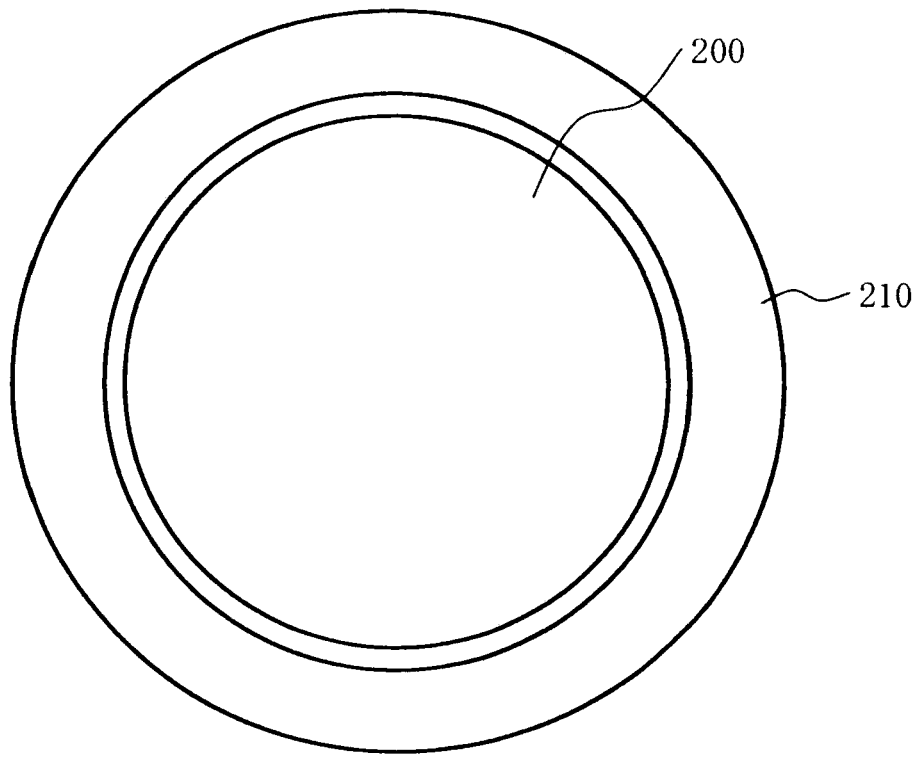
FIG. 25 is a top view showing an example of a state in which a silicon wafer is supported by a holder.
Figure 26:
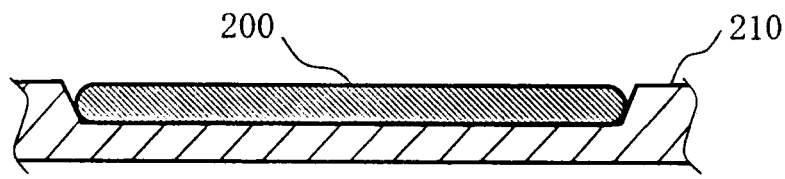
FIG. 26 is a sectional view showing a section in the state in which the silicon wafer is supported by the holder shown in FIG. 25.

The second holder 244 has an opening on an inner peripheral side and a plurality of projecting portions 258 formed in the bottom surface of the opening. The second holder 244 supports the first holder 242 such that the distal end portion of the projecting portions 258 is brought into contact with the back surface of the first holder 242. In the second holder 244, a plurality of projecting portions 256 extending to the inner peripheral side are formed on the side surface of the opening. When the first holder 242 substantially moves in a horizontal direction, the projecting portions 256 are brought into contact with the side surface of the first holder 242. More specifically, centering (alignment of a center position) of the first holder 242 is performed by the projecting portions 256. In this case, the projecting portions are arranged on the second holder 244 side. With this configuration, the same effect as described above can be obtained. The projecting portions 256 and the projecting portions 258 may be formed integrally with the second holder 244 or formed as different parts. In particular, the projecting portions 256 and the projecting portions 258 are formed different parts, only openings may be formed to fix the projecting portions to the second holder 244. For this reason, processing for the second holder 244 is preferably simple. In FIG. 23, the projecting portions 248 may be formed on the first holder 242 and the projecting portions 256 may be formed on the second holder 244. Or, In FIG. 24, the projecting portions 258 may be formed on the first holder 242 and the projecting portions 246 may be formed on the second holder 244.

In the sixth embodiment, the two types of holders are explained. In any type, the holder is divided into two different parts called first and second holders, and the first and second holders are combined to each other. For this reason, as described above, a gap may be generated at the contact portion in a precise sense. Therefore, the specific heat conductivity of the part is considerably higher than the heat conductivity of the actual contact portion. Furthermore, in the sixth embodiment, heat transfer can be considerably suppressed since a target is brought into contact with several projecting portions.

According to the embodiments described above, heat can be made difficult to be transferred to a substrate, or/and heat from the substrate can be made difficult to be escaped. As a result, the temperature of the substrate can be secured. Therefore, a temperature distribution of the substrate edge can be made preferable, and the film uniformity can be improved.

With this configuration, a temperature distribution near the edge can be kept uniform, and epitaxial growth having a size of 60 μm or more which is equal to the thickness of an n-type base having excellent film uniformity can be achieved.

As a matter of cause, the present invention can be applied to formation of epitaxial layers of thick bases of not only an IGBT, but also a power MOS which is a power semiconductor and requires a high withstand voltage or a GTO (gate turn-off thyristor) used as a switching element for an electric train or a general thyristor (SCR).

The embodiments are described with reference to the concrete examples. However, the present invention is not limited to the concrete examples. For example, an epitaxial growth apparatus is described as an example of a vapor phase deposition apparatus. However, the vapor phase deposition apparatus is not limited to the epitaxial growth apparatus. Any apparatus to perform vapor phase deposition of a predetermined film on a sample surface may be used. For example, an apparatus which grows, e.g., a polysilicon film may be used.

Parts such as apparatus configurations and control methods which are not directly required to explain the invention are omitted. However, required apparatus configurations or required control methods can be appropriately selected and used. For example, although the configuration of the control unit for controlling the epitaxial growth apparatus 100 is omitted, a required control unit configuration may be appropriately selected and used as a matter of course.

All vapor phase deposition apparatuses and all shapes of support members which include the elements of the present invention and can be appropriately changed in design by a person skilled in the art are included in the spirit and scope of the invention Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vapor phase deposition apparatus comprising:
   a chamber;
   a support table arranged in the chamber, and having a first support unit which is in contact with only a peripheral portion of a back side surface of a substrate and on which the substrate is placed and a second support unit which is connected to the first support unit to support the first support unit, a material used in the first support unit having a heat conductivity higher than that of a material used in the second support unit, wherein
   the first support unit and the second support unit are configured to rotate when a vapor phase deposition is performed for the substrate,
   notched portions are formed on an upper surface side of the first support unit and an upper surface side of the second support unit at a position which the first support unit and the second support unit are connected to each other, and a space is formed by the notched portion of the first support unit and the notched portion of the second support unit at the position which the first support unit and the second support unit are connected to each other;

a first heat source arranged at a position having a distance from a back side surface of the substrate, the distance being larger than a distance between back side surface of the support table and the first heat source, and which heats an outer peripheral portion of the substrate and the first and second support units;

a second heat source arranged under the first heat source, so that a portion of the second heat source overlaps with the first heat source and a remaining portion of the second heat source does not overlap with the first heat source, and which heats all remaining portions of the back side surface of the substrate except for the outer peripheral portion of the substrate, not through the first heat source and the first and second support units;

a first flow path configured to supply a gas to form a film into the chamber; and a second flow path configured to exhaust the gas from the chamber, wherein the first support unit and the second support unit are configured to rotate independently from the first and the second heat sources, and the apparatus has a single wafer type system.

2. The vapor phase deposition apparatus according to claim 1, wherein silicon carbide (SiC) is used as a material of the first support unit.

3. The vapor phase deposition apparatus according to claim 2, wherein silicon nitride ($Si_3N_4$) is used as a material of the second support unit.

4. The vapor phase deposition apparatus according to claim 1, wherein the first and second support units are formed as physically different parts, and the first support unit is placed on a part of the second support unit.

* * * * *